United States Patent
Ling et al.

(10) Patent No.: US 10,049,082 B2
(45) Date of Patent: Aug. 14, 2018

(54) DOT PRODUCT BASED PROCESSING ELEMENTS

(71) Applicant: Altera Corporation, San Jose, CA (US)

(72) Inventors: Andrew Chaang Ling, Toronto (CA); Davor Capalija, Etobicoke (CA); Tomasz Sebastian Czajkowski, Toronto (CA); Andrei Mihai Hagiescu Miriste, Toronto (CA)

(73) Assignee: ALTERA CORPORATION, San Jose, CA (US)

( * ) Notice: Subject to any disclaimer, the term of this patent is extended or adjusted under 35 U.S.C. 154(b) by 30 days.

(21) Appl. No.: 15/266,192

(22) Filed: Sep. 15, 2016

(65) Prior Publication Data

US 2018/0074996 A1    Mar. 15, 2018

(51) Int. Cl.
*G06F 7/52* (2006.01)
*G06F 17/16* (2006.01)
*H01L 21/66* (2006.01)
*H01L 27/02* (2006.01)

(52) U.S. Cl.
CPC .............. *G06F 17/16* (2013.01); *H01L 22/34* (2013.01); *H01L 27/0207* (2013.01)

(58) Field of Classification Search
CPC ...... G06F 17/16; H01L 22/34; H01L 27/0207
USPC ....................................................... 708/607
See application file for complete search history.

(56) References Cited

U.S. PATENT DOCUMENTS

| | | | | |
|---|---|---|---|---|
| 5,081,573 A | * | 1/1992 | Hall | G06F 17/16 712/6 |
| 5,311,459 A | * | 5/1994 | D'Luna | G06F 17/16 708/319 |
| 6,891,538 B1 | * | 5/2005 | Tannenbaum | G06F 17/16 345/426 |
| 8,521,800 B1 | * | 8/2013 | Bergland | G06F 9/3001 708/523 |
| 8,959,136 B1 | | 2/2015 | Cheung et al. | |
| 9,600,278 B1 | * | 3/2017 | Langhammer | G06F 9/3001 |
| 2004/0117422 A1 | * | 6/2004 | Debes | G06F 7/4812 708/523 |
| 2005/0144212 A1 | | 6/2005 | Simkins et al. | |
| 2005/0240646 A1 | | 10/2005 | Lin | |
| 2006/0195496 A1 | | 8/2006 | Vadi et al. | |
| 2008/0071851 A1 | * | 3/2008 | Zohar | G06F 7/5443 708/626 |

FOREIGN PATENT DOCUMENTS

WO    2009035774 A1    3/2009

OTHER PUBLICATIONS

PCT International Search Report & Written Opinion for PCT Application No. PCT/US2017/050989 dated Dec. 20, 2017; 15 Pages.

* cited by examiner

*Primary Examiner* — Tan V. Mai
(74) *Attorney, Agent, or Firm* — Fletcher Yoder, P.C.

(57) ABSTRACT

Systems and methods for calculating a dot product using digital signal processing units that are organized into a dot product processing unit for dot product processing using multipliers and adders of the digital signal processing units.

16 Claims, 7 Drawing Sheets

US 10,049,082 B2

DOT PRODUCT BASED PROCESSING ELEMENTS

BACKGROUND

The present disclosure relates generally to integrated circuits, such as field programmable gate arrays (FPGAs). More particularly, the present disclosure relates to dot-product processing implemented on an integrated circuit.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Vector dot product processing is often used in digital signal processing algorithms (e.g., audio/video codecs, video or audio processing, etc.). When implementing digital signal processors (DSPs) on integrated circuit devices, including reconfigurable devices such as field programmable gate arrays (FPGAs), physical area and speed of dot product processing structure are factors to ensure that the integrated circuit device is both suitable in size and speed for the task to be performed. However, the dot product computations may utilize individual DSPs and memory resources for each function that increase route length thereby possibly increasing area and performance as well.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for enhancing performance of dot product processing using reconfigurable devices, such as field programmable gate arrays (FPGAs). Specifically, a macro of a coarsened dot product processing unit may be used to efficiently take advantage of space in a reconfigurable device while ensuring satisfactory performance. Furthermore, by organizing the reconfigurable device into a unit that performs the dot product processing without using more general routing paths that may be used in integrated circuits where different digital signal processing blocks are used disparately with potential for numerous long paths that negatively effect performance of the integrated circuit.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
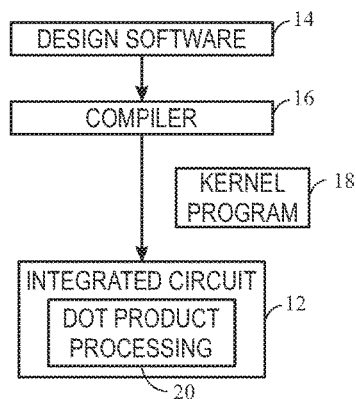
FIG. 1 is a block diagram of a system that utilizes dot product processing, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

This disclosure describes a technique to use enhanced dot-product processing elements (PEs) on integrated circuits, including reconfigurable devices. This resulting PE architecture is well suited for associative computation such as matrix multiplies or convolutions, and can be chained together to implement systolic arrays. The technique also is based on coarsening the dot-product to larger sizes, which yields more efficient resource utilization. The technique also assists in an overall computer aided design (CAD) flow, since a coarsened dot-product may be placed as a large macro with less atoms to be placed and routes to be formed. The coarsening technique supports data interleaving techniques to enable heavy pipelining and caching for data reuse. Coarsening also improves mapping of the dot-product to reduce a total number of digital signal processing (DSP) units used. Moreover, depending on a matrix size to be implemented, the dot-product coarsened size may be adjusted to yield efficient results based at least in part on the matrix size. For example, a DSP unit may be included for each element in a vector of the matrix being dot-processed. Specifically, in some embodiments, a four-vector dot product may be implemented using a dot product processing macro that includes four DSP units in a column in a single macro to implement the dot product processing of the four-vectors.

Specifically, the dot product PE utilizes an adder tree and multiplication inputs to yield an efficient dot product computation. Coarsening the dot product reduces resource requirements, since dedicated high-speed routes between adjacent DSPs can be leveraged. Coarsening the dot product also may simplify the placement and routing problem, since dot-product may be placed as a large contiguous block thereby reducing the number of placement objects and general purpose routes. While the techniques of this disclosure are described chiefly in the context of reconfigurable devices, such as programmable logic devices with field programmable gate array (FPGA) fabric, this is meant to illustrative and not limiting. Indeed, the dot-product circuitry of this disclosure may be implemented in other integrated circuits. Other types of integrated circuits, such as applicant-specific integrated circuits (ASICs), microprocessors, memory devices, transceivers, and the like, may also use the dot-product circuitry of this disclosure.

With the foregoing in mind, FIG. 1 illustrates a block diagram of a system 10 that includes dot product processing operations that may reduce a logical area and/or increase a speed that is typically used for such an implementation. As discussed above, a designer may desire to implement functionality on an integrated circuit, such as a reconfigurable integrated circuit 12, such as a field programmable gate array (FPGA). The designer may implement a circuit design to be programmed onto the IC 12 using design software 14, such as a version of Quartus by Altera™. The design software 14 may use a compiler 16 to generate a low-level circuit-design kernel program 18, sometimes known as a program object file or bitstream, that programs the integrated circuit 12. That is, the compiler 16 may provide machine-readable instructions representative of the circuit design to the IC 12. For example, the IC 12 may receive one or more kernel programs 18 that describe the hardware implementations that should be stored in the IC. In some embodiments, dot-product processing operations 20 may be implemented on the integrated circuit 12. For example, the dot-product processing operations 20 may be used to operate on as single-precision floating-point numbers, double-precision floating-point numbers, or other suitable objects for dot-product processing. As will be described in more detail below, the dot-product processing operations 20 may coarsened into a large macro that may be inserted into a design using lower numbers of general routing resources (or non-DSP block resources). For example, two DSP blocks for single-precision floating-point addition may be combined as discussed below to form a double-precision floating-point adder.

Figure 2:
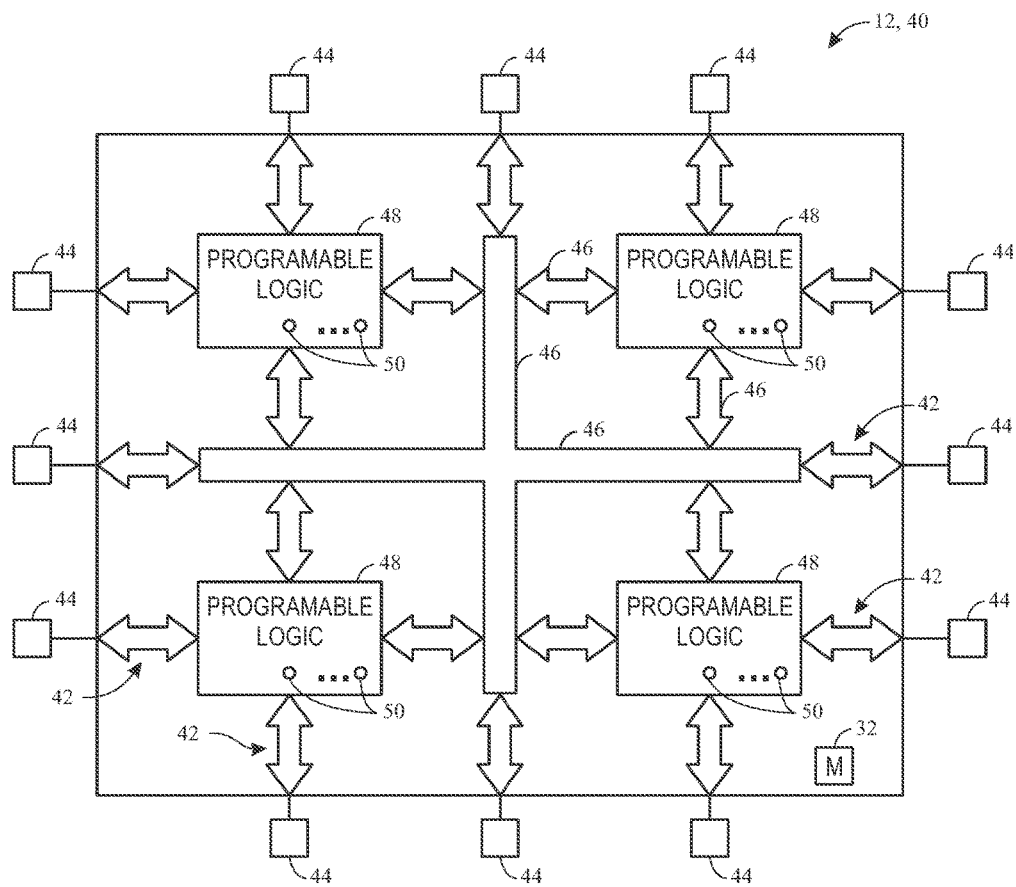
FIG. 2 is a block diagram of a programmable logic device that may include logic useful for implementing dot product processing, in accordance with an embodiment.

Turning now to a more detailed discussion of the IC 12, FIG. 2 illustrates an IC device 12, which may be a programmable logic device, such as a field programmable gate array (FPGA) 40. For the purposes of this example, the device 40 is referred to as an FPGA, though it should be understood that the device may be any type of reconfigurable device (e.g., an application-specific integrated circuit and/or application-specific standard product). As shown, FPGA 40 may have input/output circuitry 42 for driving signals off of device 40 and for receiving signals from other devices via input/output pins 44. Interconnection resources 46, such as global and local vertical and horizontal conductive lines and buses, may be used to route signals on device 40. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48. As discussed in further detail below, the FPGA 40 may include adaptable logic that enables partial reconfiguration of the FPGA 40, such that kernels may be added, removed, and/or swapped during the runtime of the FPGA 40.

Programmable logic devices, such as FPGA 40, may contain programmable elements 50 within the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may include one or more logic elements (wires, gates, registers, etc.). For example, during programming, configuration data is loaded into the memory 52 using pins 44 and input/output circuitry 42. In some embodiments, the memory 52 may be implemented as random-access-memory (RAM) cells. The use of memory 52 based on RAM technology is described herein is intended to be only one example. Moreover, memory 52 may be distributed (e.g., as RAM cells) throughout the device 40. Further, because these RAM cells are loaded with configuration data during programming, they are sometimes referred to as configuration RAM cells (CRAM). The memory 52 may provide a corresponding static control output signal that controls the state of an associated logic component in programmable logic 48. For instance, in some embodiments, the output signals may be applied to the gates of metal-oxide-semiconductor (MOS) transistors within the programmable logic 48. In some embodiments, the programmable elements 50 may include DSP blocks that implement common operations, such as dot product processing elements implemented using DSP blocks.

The circuitry of FPGA 40 may be organized using any suitable architecture. As an example, the logic of FPGA 40 may be organized in a series of rows and columns of larger programmable logic regions, each of which may contain multiple smaller logic regions. The logic resources of FPGA 40 may be interconnected by interconnection resources 46 such as associated vertical and horizontal conductors. For example, in some embodiments, these conductors may include global conductive lines that span substantially all of FPGA 40, fractional lines such as half-lines or quarter lines that span part of device 40, staggered lines of a particular length (e.g., sufficient to interconnect several logic areas), smaller local lines, or any other suitable interconnection resource arrangement. Moreover, in further embodiments, the logic of FPGA 40 may be arranged in more levels or layers in which multiple large regions are interconnected to form still larger portions of logic. Still further, some device arrangements may use logic that is arranged in a manner other than rows and columns.

As discussed above, the FPGA 40 may allow a designer to create a customized design capable of executing and performing customized functionalities. Each design may have its own hardware implementation to be implemented on the FPGA 40. These hardware implementations may include floating-point operations using the DSP blocks of the programmable elements 50.

A dot product may be defined algebraically as the sum of the products of the corresponding entries in the vectors undergoing the dot product calculation. For example, Equation 1 illustrates a dot product expression of two 4-vector dot product algebraically:

$$\vec{A} \cdot \vec{B} = [A_1, A_2, A_3, A_4] \cdot \begin{bmatrix} B_1 \\ B_2 \\ B_3 \\ B_4 \end{bmatrix} = \quad \text{(Equation 1)}$$

$$A_1 B_1 + A_2 B_2 + A_3 B_3 + A_4 B_4$$

where $A_1$, $A_2$, $A_3$, and $A_4$ are elements in the A vector, and $B_1$, $B_2$, $B_3$, and $B_4$ are elements in the B vector. For example, the elements in the A vector may correspond to a timelike element and three spacelike elements. The elements in the B vector may be another vector, some scaling values, equivalent to the A vector elements, or some other operations, such Lorentz transformations.

Figure 3:
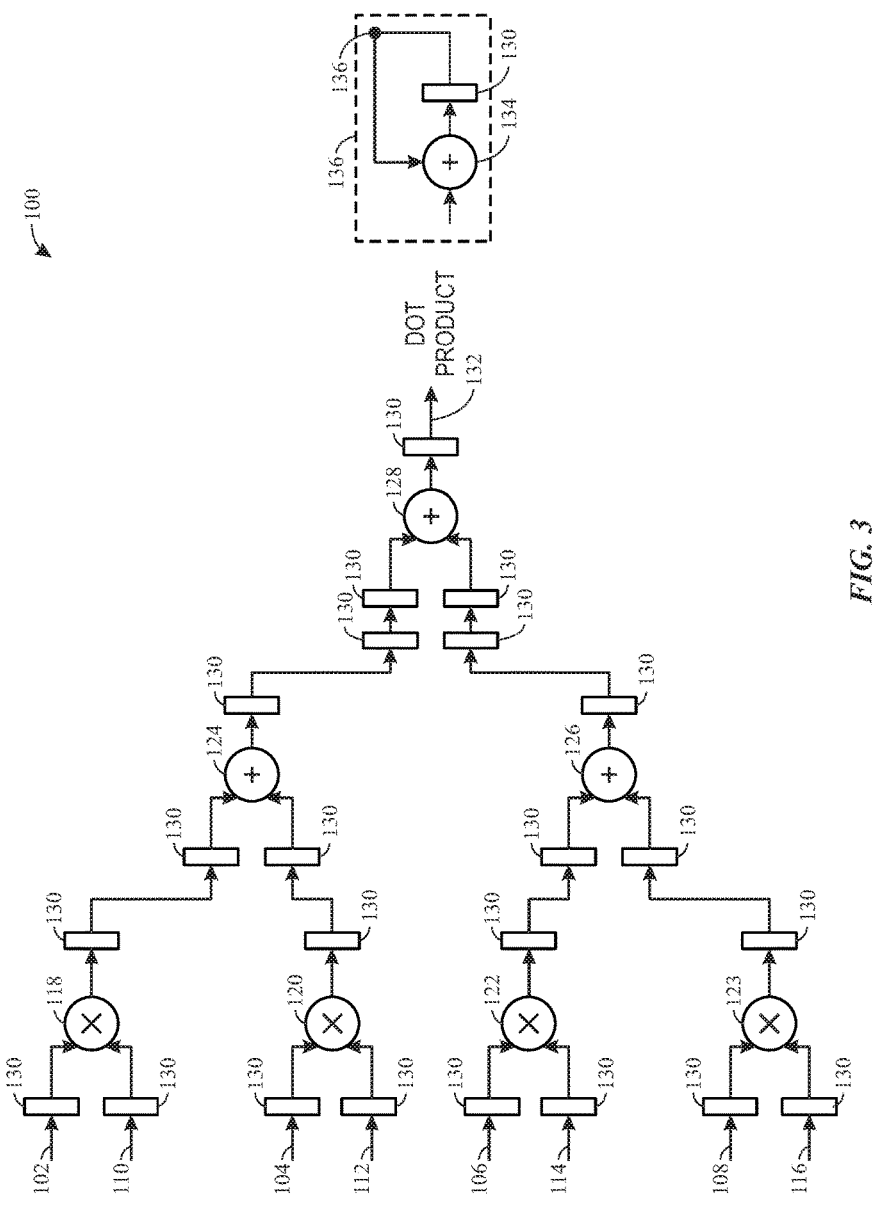
FIG. 3 is a block diagram illustrating a dot product processing circuit, in accordance with an embodiment.

FIG. 3 illustrates a 4-vector dot product circuit 100. A first vector is submitted to the circuit 100 as its constituent elements 102, 104, 106, and 108, and a second vector is submitted as its constituent set of elements 110, 112, 114, and 116 dot-product with the first vector. The second set of elements 110, 112, 114, and 116 may be different values or may be the same value. For example, the second set of elements 110, 112, 114, and 116 may be a second four vector. Each pair of corresponding elements is submitted to respective multiplier that multiply the elements together. Specifically, elements 102 and 110 are multiplied together in a multiplier 118 to form a product; elements 104 and 112 are multiplied together in a multiplier 120 to form a product; elements 106 and 114 are multiplied together in a multiplier 122 to form a product; and elements 108 and 116 are multiplied together in a multiplier 124 to form a product. The products are then added together. In some embodiments, the products may be added together in a single 4-input adder. Additionally or alternatively, the products may be added together using a sequential addition that reduces a number of products by half in each round of addition, which may continue until a total sum is found that indicates the cross-product of the first vector and the second vector. For example, the product of elements 102 and 110 and the product of elements 104 and 112 are added together in an adder 124; the product of the elements 106 and 114 and the product of elements 108 and 116 are added together in an adder 126. The sums from the adders 124 and 126 are then added together in another adder 128. In some embodiments, the circuit 100 includes registers 130 that are used to ensure that the respective portions of the dot product calculations are substantially synchronized in processing. The registers 130 also ensure that the data being calculated is transferred properly. The output of the adder 128 is a dot product 132.

In some embodiments, the dot product 132 may be submitted to an accumulator 133 to form a running sum. The accumulator 133 includes an adder 134 that adds in a recent dot product with a running total 136. In other words, the accumulator 133 receives a dot product and adds it to all previous dot products so that a running total of dot products may be calculated.

Figure 4:
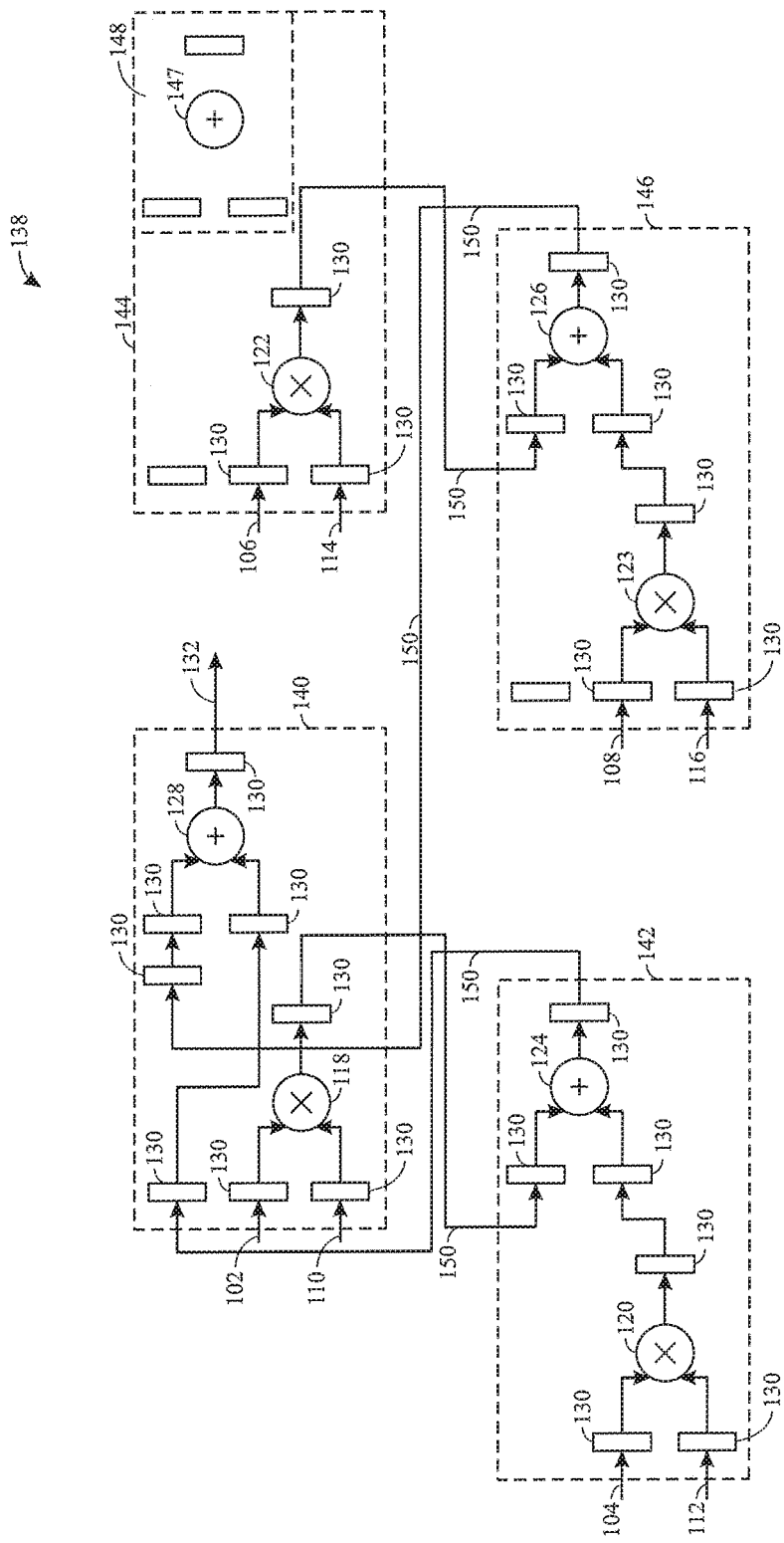
FIG. 4 is a block diagram illustrating the dot product processing circuit of FIG. 3 implemented using individual digital signal processing units, in accordance with an embodiment.

FIG. 4 illustrates a circuit 138 that may be used to implement the dot product circuit 100 of FIG. 3 in a reconfigurable device using digital signal processing (DSP) blocks 140, 142, 144, and 146. As illustrated, each of the DSP blocks 140, 142, 144, and 146 includes an adder (e.g., adders 124, 126, 128, and 137) and a multiplier (e.g., multipliers 118, 120, 122, and 123) that are routed in a way that provides 4-vector dot product processing. As illustrated, a portion (e.g., portion 148) of one or more DSP blocks (e.g., DSP block 144) remains unused. Furthermore, a routing 150 between the DSP blocks 140, 142, 144, and 146 may be long in relation to routes inside the DSP blocks 140, 142, 144, and 146. This may be due to placement of the DSP blocks 140, 142, 144, and 146 in relatively disparate locations within the IC 12. Such routing may result in decreased performance of the dot product calculations using the circuitry 138. To reduce such routing, the dot product processing may be coarsened into a relatively large macro, also referred to as an atom, that may be designed into the reconfigurable device to reduce routing between DSP blocks.

Figure 5:
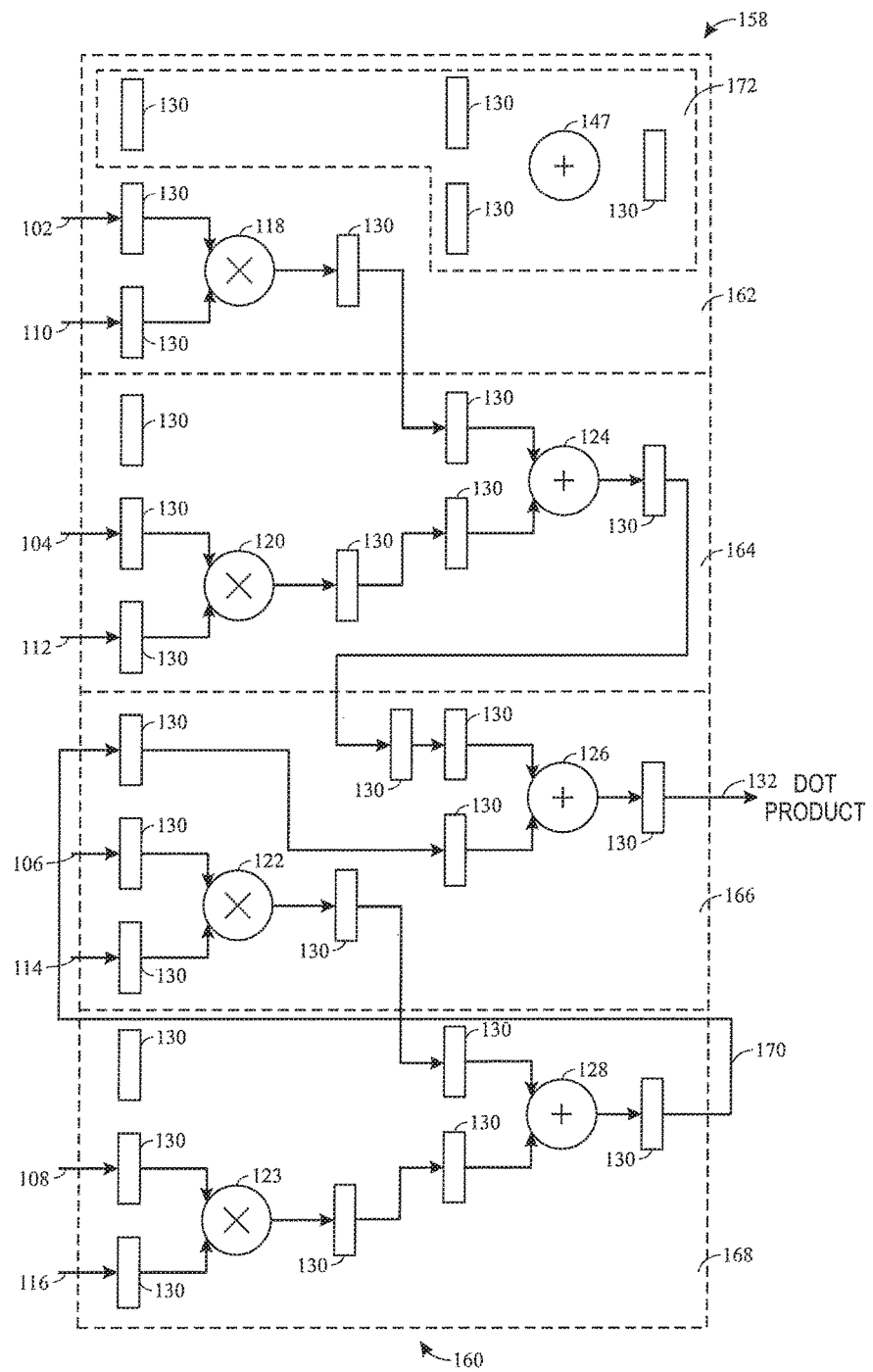
FIG. 5 is a block diagram illustrating the dot product processing circuit of FIG. 3 implemented using a coarsened dot product processing unit, in accordance with an embodiment.

FIG. 5 illustrates a circuit 158 that includes a coarsened 4-vector dot product processing macro that may be added to an integrated circuit such as a reconfigurable device. The circuit 158 includes all calculations of the circuit 100. However, as opposed to the circuit 138, the circuit 158 includes a DSP column 160 includes DSP blocks 162, 164, 166, and 168. The DSP blocks 162, 164, 166, and 168 are located in the DSP column 160 to reduce inter-DSP block routing using general routing in the reconfigurable device, thereby increasing device performance and/or area consumption. Specifically, the circuit 158 includes only a single general route 170. Similar to the DSP blocks 140, 142, 144, and 146, each of the DSP blocks 162, 164, 166, and 168 includes an adder and a multiplier. In the particular embodiment of the 4-element vector dot product illustrated in FIG. 5, a portion 172 of the DSP block 162 is unused.

Figure 6:
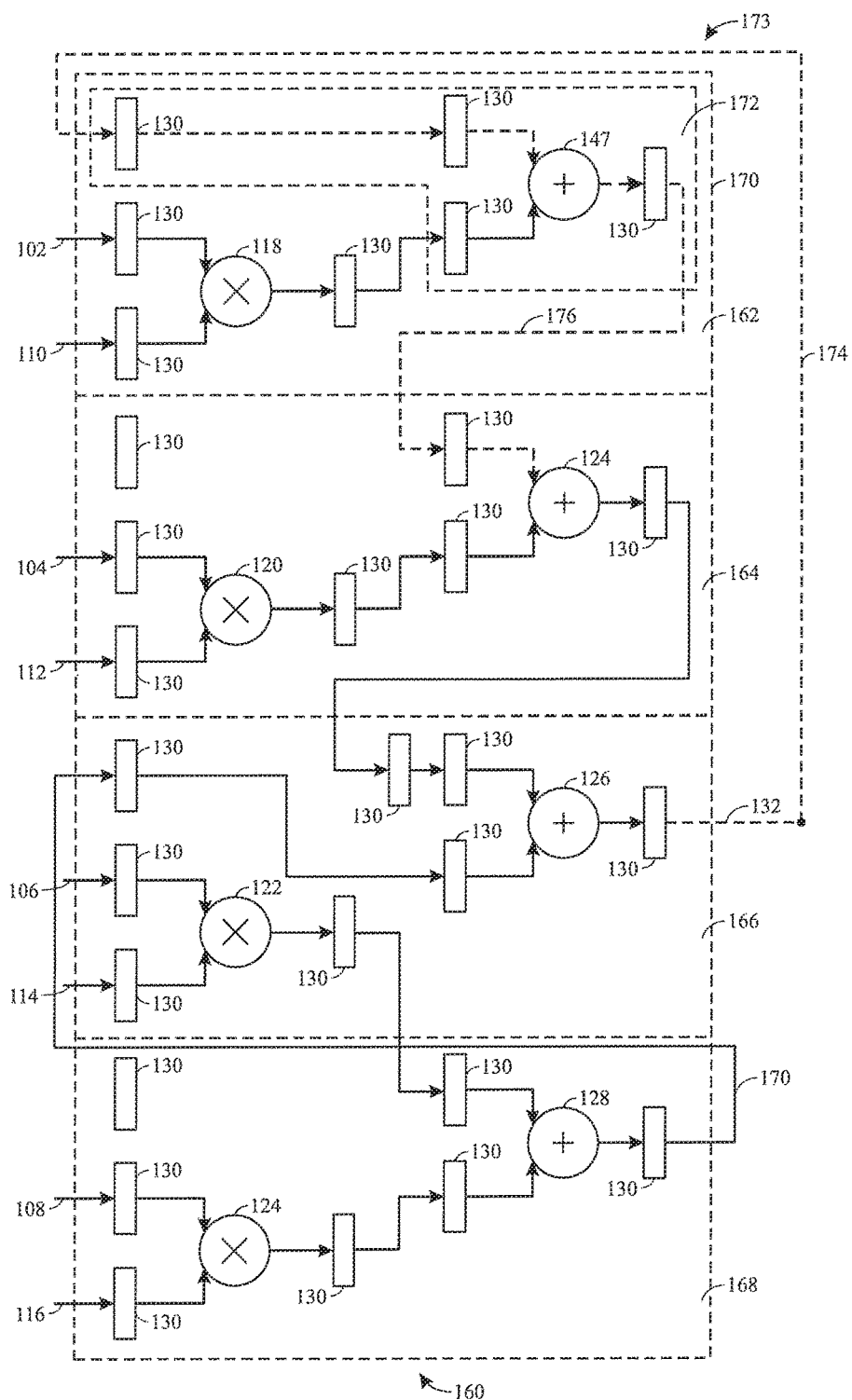
FIG. 6 is a block diagram illustrating the dot product processing circuit of FIG. 5 with an accumulator configured to create a running sum of dot products, in accordance with an embodiment.

In some embodiments, this portion 172 may be used for calculations outside of simple 4-vector dot product calculations. For example, FIG. 6 illustrates a circuit 173 that utilizes the portion 172 to implement an accumulator to find a running sum of dot products. Specifically, the adder 147 is used to add a previous dot product 132 to a product of the elements 102 and 110 via accumulator route 174. This sum of the previous dot product 132 is then added with the product of elements 104 and 112. This additional summation adds one more degree of latency in exchange for the running total.

Figure 7:
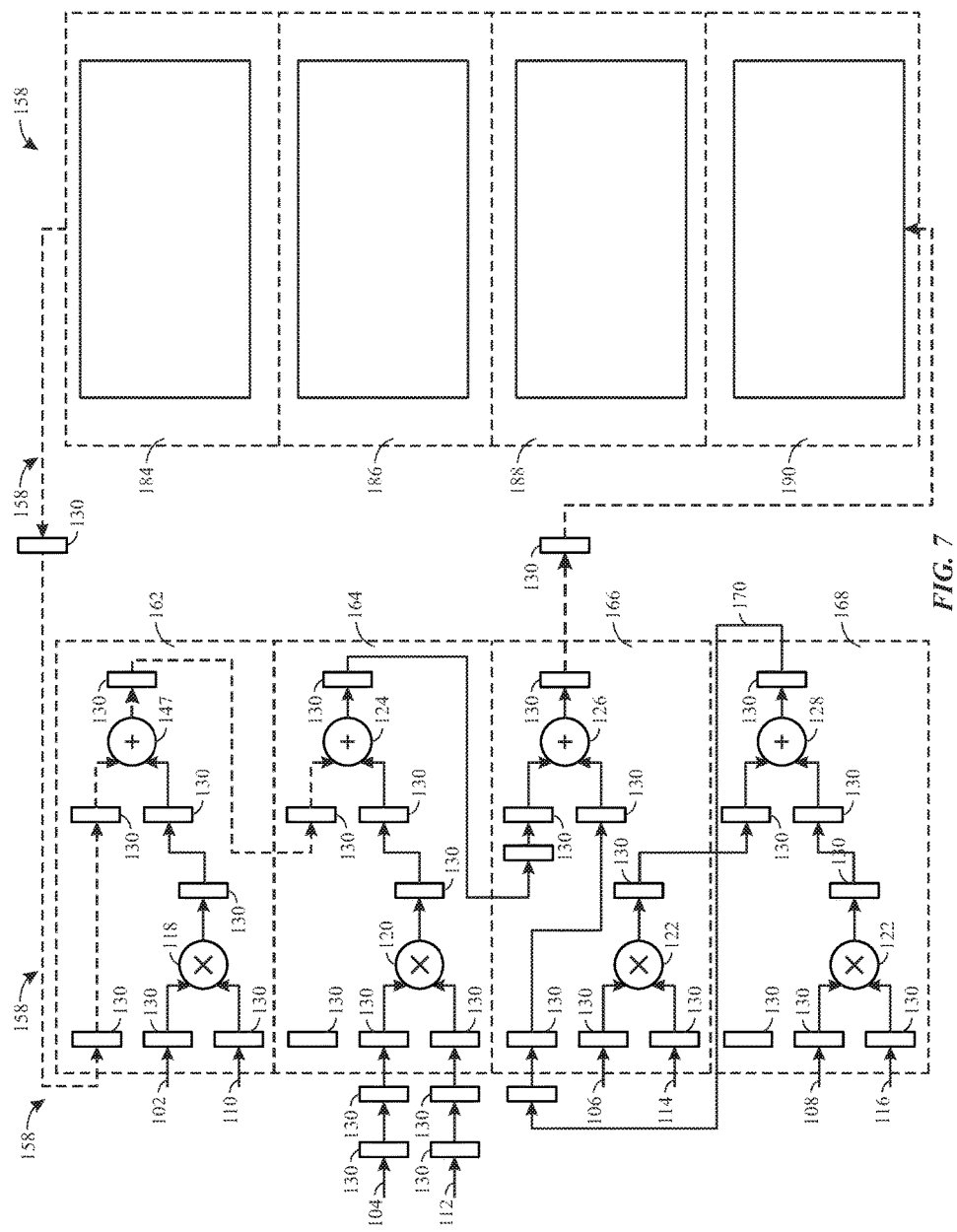
FIG. 7 is a block diagram illustrating the dot product processing circuit of FIG. 5 with a memory cache, in accordance with an embodiment.

FIG. 7 illustrates a cache accumulator circuit 178 that includes an accumulator cache 180 that stores previous dot products. The accumulator cache 180 includes a memory column 182. The memory column 182 includes multiple memory blocks 184, 186, 188, and 190 collectively referred to as memory blocks 184-190. The memory blocks 184-190 may include any suitable memory blocks, such as M20K memory blocks by Altera® Corporation. The memory blocks 184-190 may store a relatively large amount of sums. For example, the memory blocks 184-190 may store any exponent of two running sums, such as 128, 256, 512, 1024, 2048, etc. Each sum may increase latency of the circuit 178 over latency of the circuit 158 of FIG. 5 in exchange for the extra summations corresponding to previous dot products. For example, storing 2048 sums may increase latency by 2048.

Figure 8:
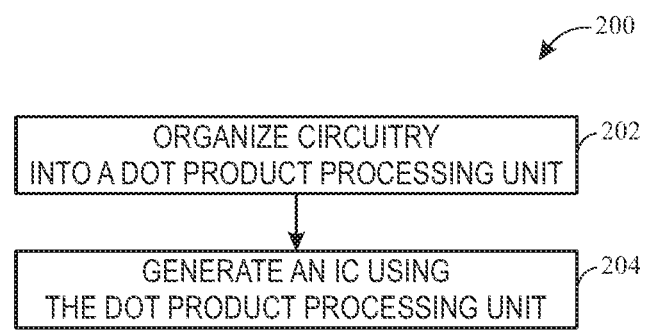
FIG. 8 is a process for calculating a dot product using a coarsened dot product processing unit, in accordance with an embodiment.

FIG. 8 illustrates a process 200 for calculating a dot product using an integrated circuit. The process 200 includes organizing circuitry into a dot product processing unit for dot product processing (block 202). The dot product processing unit includes two or more digital signal processing blocks to reduce an amount of general purpose routing used in the dot product processing if using individual digital signal processing blocks. The dot product processing unit is a coarsened dot product process that includes a number of digital signal processing units based on size of a matrix (or individual vectors) that are being processed using dot products. For example, four digital signal processing units may be included for a four vector (i.e., a vector with four constituent elements), and eight digital signal processing units may be included for an eight vector. This dot product processing unit may be used in generation of an integrated circuit (block 204), which may include programming a programmable logic device or an ASIC, for example. As previously discussed, the coarsened dot product processing enables use of less general routing than individually used digital signal processing units separately configured since more routes and longer routes are used in the individually used digital signal processing units. In other words, by creating a single chunk that may be sized according to dot product matrix sizes, the performance of the integrated circuit device implementing the dot product processing may be increased.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A method for calculating a dot product using an integrated circuit, comprising:
   organizing circuitry into dot product processing unit for dot product processing, wherein the dot product processing unit that includes two or more digital signal processing blocks wherein the digital signal processing blocks each include an adder configured to add inputs and a multiplier configured to multiply inputs; and
   generating the integrated circuit with the dot product processing unit by locating the dot product processing unit in the integrated circuit as an integratable unit, wherein generating the integrated circuit comprises:
      placing a first digital signal processing unit of the two or more digital signal processing units that receives a first input pair, multiplies the first input pair together as a first product, and outputs the first product;
      placing a second digital signal processing unit of the two or more digital signal processing units that receives a second input pair, multiplies the second input pair together as a second product, sums the first product and the second product as a first sum, and outputs the first sum;
      placing a third digital signal processing unit of the two or more digital signal processing units that receives a third input pair, multiplies the third input pair together as a third product, adds the first sum and a second sum together to form the dot product, and outputs the dot product; and
      placing a fourth digital signal processing unit of the two or more digital signal processing units that receives a fourth input pair, multiplies the fourth input pair together as a fourth product, adds the third product and the fourth product together as the second sum, and outputs the second sum.

2. The method of claim 1, wherein a number of digital signal processing blocks corresponds to a size of matrix being processed.

3. The method of claim 2, wherein the number of digital signal processing blocks is equal to a number of elements to be processed in a dimension of the matrix.

4. The method of claim 3, wherein the number of elements comprises a number of objects in a vector.

5. The method of claim 1, wherein the dot product processing unit comprises only a single path of general purpose routing for the integrated circuit.

6. The method of claim 1, wherein organizing circuitry into the dot product processing unit comprises organizing the two or more digital signal processing blocks into a column of digital signal processing blocks.

7. The method of claim 1, comprising adding previous dot product results using an accumulator.

8. The method of claim 7, wherein the accumulator uses a portion of the first digital signal processing unit that is not used in the dot product processing.

9. The method of claim 8, comprising storing accumulated dot products in a cache memory using the portion of the one of the two or more digital signal processing blocks.

10. An integrated circuit (IC) device comprising:
    a dot product processing unit configured to be located in the integrated circuit as a whole, wherein the dot product processing unit comprises:
       a plurality of digital signal processing units, comprising:
          a first digital signal processing unit that receives a first input pair, multiplies the first input pair together as a first product, and outputs the first product;
          a second digital signal processing unit that receives a second input pair, multiplies the second input pair together as a second product, sums the first product and the second product as a first sum, and outputs the first sum;
          a third digital signal processing unit that receives a third input pair, multiplies the third input pair together as a third product, adds the first sum and a second sum together to form a dot product, and outputs the dot product; and
          a fourth digital signal processing unit that receives a fourth input pair, multiplies the fourth input pair together as a fourth product, adds the third product and the fourth product together as the second sum, and outputs the second sum.

11. The IC device of claim 10, comprising a memory cache configured to store previous dot products.

12. The IC device of claim 10, comprising adding, using an adder of the first digital signal processing unit of the plurality of digital signal processing units to add a previous dot product with a current dot product or current partial dot product.

13. The IC device of claim 10, wherein the plurality of digital signal processing units are arranged into a column using only a single general route of reconfigurable fabric in the IC device.

14. An integrated circuit (IC) device comprising:
   a first digital signal processing unit located at a first end of a digital signal processing unit column, comprising:
      a first multiplier configured to multiply a first input pair together that is input to the first digital signal processing unit to form a first product; and
      a first adder;
   a second digital signal processing unit located adjacent to the first digital signal processing unit in the digital signal processing unit column, comprising:
      a second multiplier configured to multiply a second input pair together that is input to the second digital signal processing unit to form a second product; and
      a second adder configured to add a value from the first digital signal processing unit to the second product as a first sum;
   a third digital signal processing unit located adjacent to the second digital signal processing unit in the digital signal processing unit column, comprising:
      a third multiplier configured to multiply a third input pair together that is input to the third digital signal processing unit to form a third product; and
      a third adder configured to add the first sum to a second sum to generate a dot product; and
   a fourth digital signal processing unit located adjacent to the third digital signal processing unit in the digital signal processing unit column, comprising:
      a fourth multiplier configured to multiply a fourth input pair together that is input to the fourth digital signal processing unit to form a fourth product; and
      a fourth adder configured to add the third product and the fourth product together as the second sum.

15. The IC device of claim 14, wherein the first adder is configured to add the first product to a previous dot product calculated by the IC device to generate the value from first digital signal processing unit.

16. The IC device of claim 14, wherein the first adder is configured to add the first product to a running sum of previous dot product calculations to generate the value from the first digital signal processing unit.

\* \* \* \* \*